United States Patent
Liu

(10) Patent No.: US 6,664,142 B2
(45) Date of Patent: Dec. 16, 2003

(54) LASER REPAIR OPERATION

(75) Inventor: Hermen Liu, Taoyuan Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/260,253

(22) Filed: Sep. 30, 2002

(65) Prior Publication Data

US 2003/0036211 A1 Feb. 20, 2003

Related U.S. Application Data

(62) Division of application No. 09/923,665, filed on Aug. 6, 2001.

(51) Int. Cl.[7] .......................... H01L 21/82; H01L 21/00; H01L 21/66

(52) U.S. Cl. .............................. 438/132; 438/4; 438/17

(58) Field of Search ............................... 438/4, 14, 17, 438/16, 132

(56) References Cited

U.S. PATENT DOCUMENTS

| | | | | |
|---|---|---|---|---|
| 5,326,709 A | * | 7/1994 | Moon et al. | 437/8 |
| 5,641,701 A | * | 6/1997 | Fukuhara et al. | 438/6 |
| 6,372,522 B1 | * | 4/2002 | Weling et al. | 438/4 |
| 6,395,622 B1 | * | 5/2002 | Liu et al. | 438/497 |

* cited by examiner

Primary Examiner—Kamand Cuneo
Assistant Examiner—Scott B Geyer
(74) Attorney, Agent, or Firm—Charles C. H. Wu; Wu & Cheung, LLP

(57) ABSTRACT

A method of conducting a laser repair operation. A silicon wafer has a plurality of chips thereon. Each chip has a plurality of bonding pads, a plurality of testing pads, a plurality of fuses and a passivation layer for protecting the chip. The passivation layer exposes the bonding pads an the testing pads. A bump-forming process is conducted to form a bottom metallic layer and a bump sequentially over each bonding pad. Only a bottom metallic layer is formed over each testing pad. The bumps are formed, for example, by electroplating or printing. Testing is carried out by probing various bottom metallic layers above the testing pads. Finally, a laser repair is conducted.

4 Claims, 7 Drawing Sheets

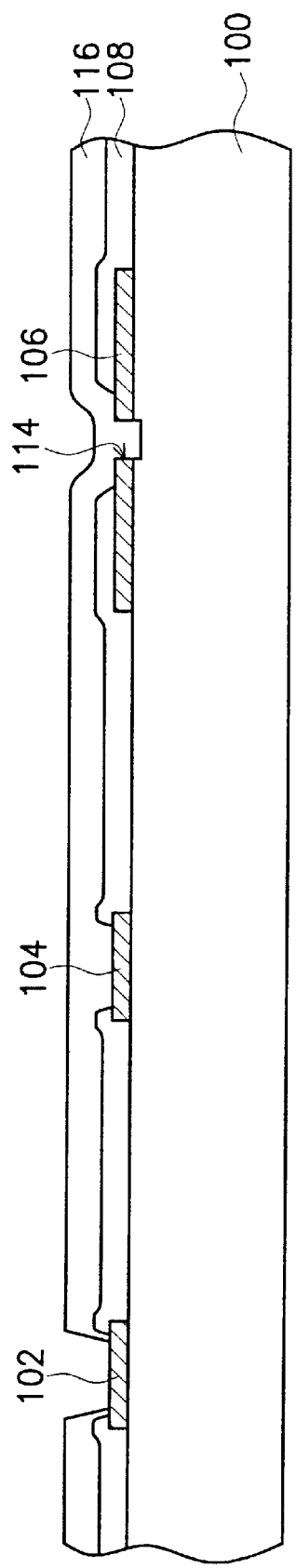
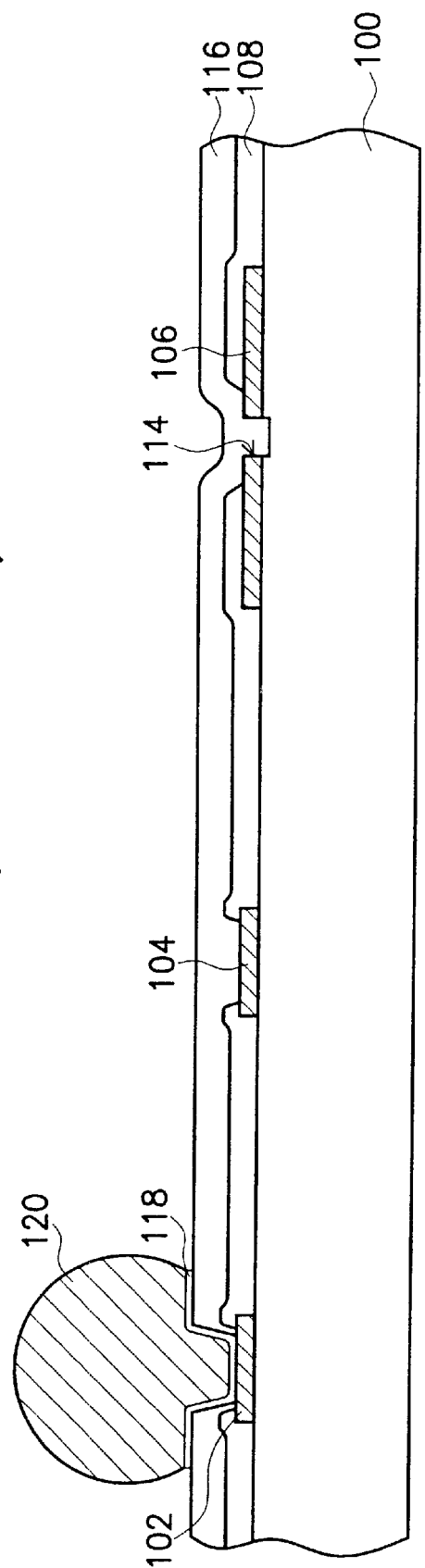
FIG. 3 (PRIOR ART)
FIG. 4 (PRIOR ART)

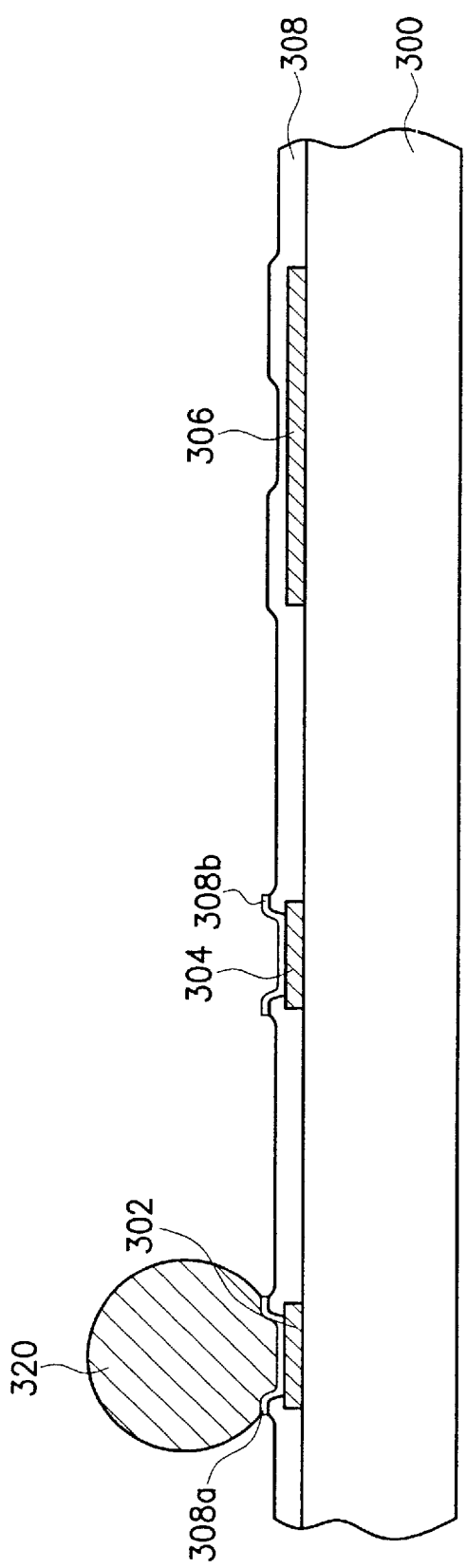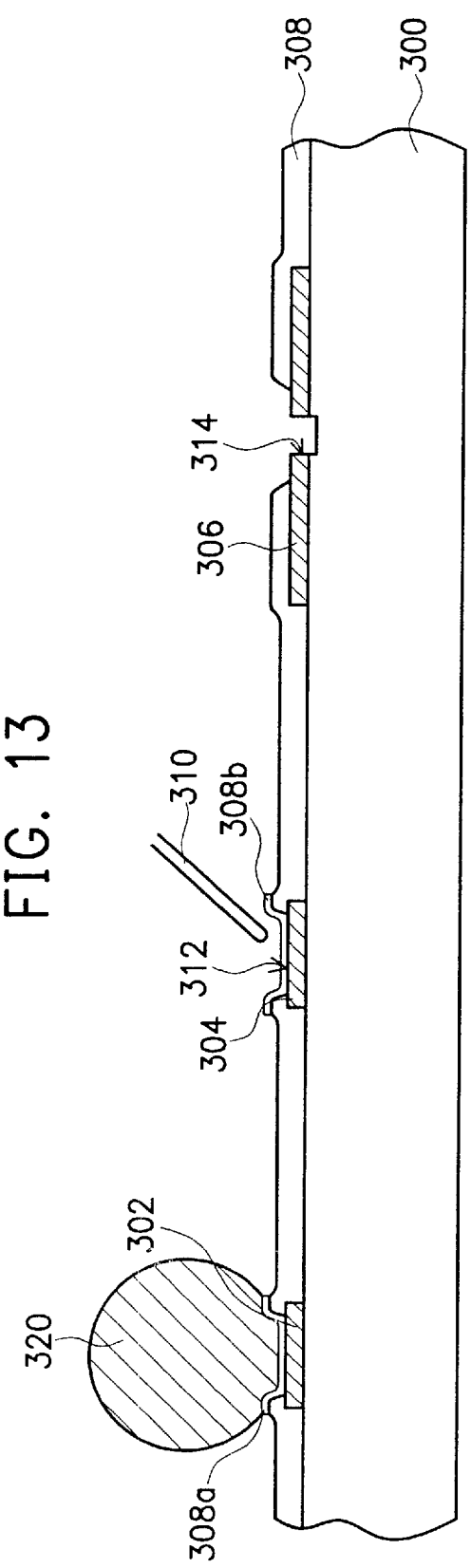

LASER REPAIR OPERATION

This is a division of application Ser. No. 09/923,665 filed Aug. 6, 2001.

BACKGROUND OF THE INVENTION

1. Field of Invention

The present invention relates to a type of laser repair. More particularly, the present invention relates to a laser repair operation of a silicon wafer before conducting a bump-forming process.

2. Description of Related Art

Integrated circuits are complicated electronic products whose manufacturing involves a series of major activities including integrated circuit design wafer fabrication, wafer testing and wafer packaging. In general, manufactured integrated circuits must undergo a series of tests before shipping just to ensure a high product quality. The results provided by these tests are essential also for repairing any malfunctional integrated circuits. As usual, natural yield of integrated circuit is relatively low. Hence, on discovering some defects in the circuit of a silicon chip, a laser repair operation is often conducted. In the repair process, a number of fuses are generally burnt by a laser so that specially designed redundant bit lines can replace the defective bit lines. Ultimately, product yield of the wafer may increase considerably.

FIGS. 1 through 4 are schematic cross-sectional views showing the progression of steps in a conventional laser repair operation. First, a silicon wafer is provided. The wafer has a plurality of silicon chips 100. In FIG. 1, only a single silicon chip 100 is shown. The silicon chip 100 includes a plurality of bonding pads 102, a plurality of testing pads 104, a plurality of fuses 106 and a passivation layer 108. The passivation layer 108 protects the silicon chip 100 and includes openings that expose the bonding pads 102 and the testing pads 104.

As shown in FIG. 2, a probe 110 is used to carry out a testing operation. A probe mark 112 is formed on the testing pad 104. When any defects are found in the circuit, a laser repair operation is next carried out. In a laser repair, a laser beam aims at a fuse 106, burning a portion of the passivation layer 108 and melting open the protective fuse 106 to form a fused section 114. Specially designed redundant bit lines then replace the defective bit lines. Through the laser repair operation, the yield of silicon chips on a wafer is greatly boosted.

As shown in FIG. 3, a bump-forming process is carried out after the laser repair operation. The bump-forming process in mainly includes under ball metallurgical (UBM) layer fabrication and bump production. Since the fabrication of the UBM layer often requires etching to form the pattern, a second passivation layer 116 is formed over the silicon chip 100 to prevent unwanted etchin of the testing pad 104 and the burnt section 114. To be useful as a protective layer, the second passivation layer 116 needs also to undergo a photolithographic and etching process to form an opening 117 that exposes the bonding pads 102.

As shown in FIG. 4, a conductive layer is formed over the chip 100. Photolithographic and etching processes are conducted to form a bottom metallic layer 118 over the bonding pad 102. Finally, a bump 120 is formed over the bottom metallic layer 118, thereby completing the process of conducting a laser repair and fabricating bumps on a wafer.

Because a bump-forming process is carried out after a laser repair and an etching step is used to form the bottom metallic layer in the bump-forming process, a second passivation layer is required to protect the laser burnt fuse area. In addition, a masking step is required to form an opening that exposes the bonding pad in the second passivation layer so that a bump can be formed on the bonding pad. In general, the coating of a second passivation layer and the forming of an opening in the second passivation layer complicate the fabrication process and increase production cost.

SUMMARY OF THE INVENTION

Accordingly, one object of the present invention is to provide a laser repair operation. The laser repair operation includes fabricating a bottom metallic layer on bonding pads and testing pads, conducting a testing operation by probing the bottom metallic layer on the testing pads, and finally performing a laser repair. Since etching that might damage the exposed fuse is no longer conducted after a laser repair, forming a second passivation for protecting the broken fuses is unnecessary.

To achieve these and other advantages and in accordance with the purpose of the invention, as embodied and broadly described herein, the invention provides a method of conducting a laser repair operation. A silicon wafer having a plurality of chips thereon is provided. Each chip has a plurality of bonding pads, a plurality of testing pads, a plurality of fuses and passivation layer for protecting the chip. The passivation layer exposes the bonding pads and the testing pads. A bump-forming process is conducted to form a bottom metallic layer and a bump sequentially over each bonding pad. A bottom metallic layer is formed over each testing pad. The bumps are formed, for example, by electroplating or printing. Thereafter, testing is carried out by probing various bottom metallic layers above the testing pads. Finally, a laser repair is conducted.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1 through 4 are schematic cross-sectional views showing the progression of steps in a conventional laser repair operation;

FIGS. 10 through 14 are schematic cross-sectional views showing the progression of steps in a laser repair operation according to a second preferred embodiment of this invention.

DESCRIPTION OF THE PREFERRED EMBODIMENTS

Figure 1:
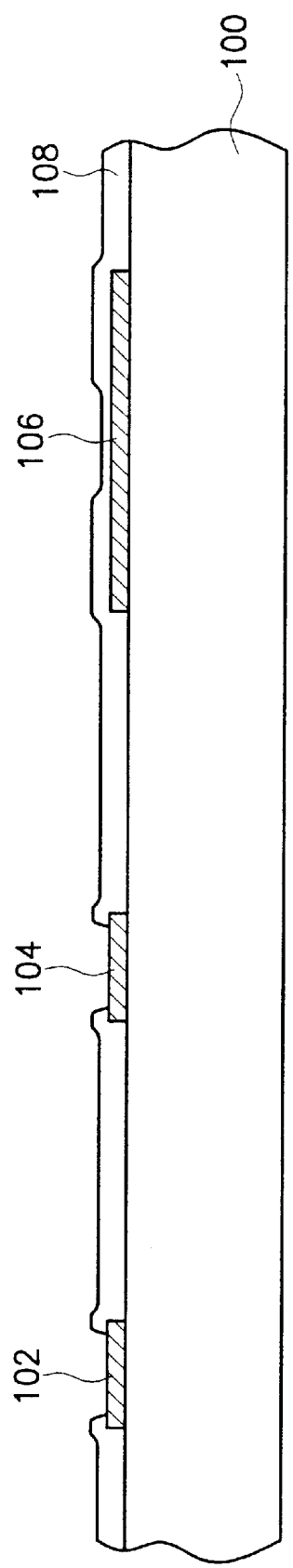
Figure 2:
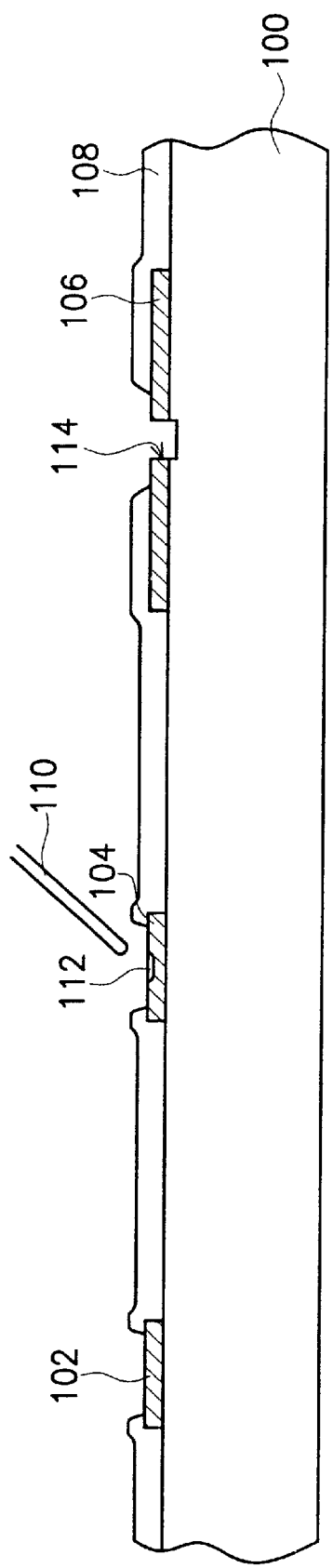

Reference will now be made in detail to the present preferred embodiments of the invention, examples of which are illustrated in the accompanying drawings. Wherever possible, the same reference numbers are used in the drawings and the description to refer to the same or like parts.

Figure 5:
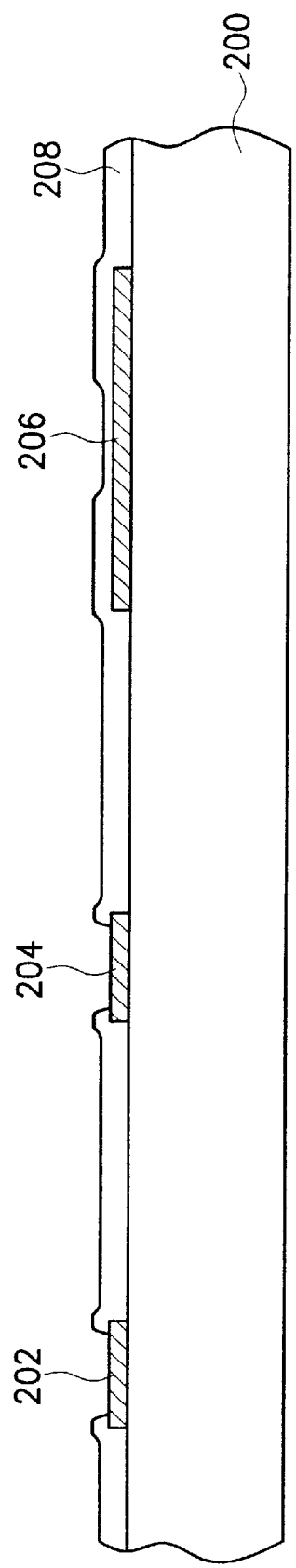
FIGS. 5 through 9 are schematic cross-sectional views showing the progression of steps in a laser repair operation according to a first preferred embodiment of this invention.

FIGS. 5 through 9 are schematic cross-sectional views showing the progression of steps in a laser repair operation according to a first preferred embodiment of this invention. As shown in FIG. 5, a silicon wafer having a plurality of chips 200 thereon is provided. Only a single chip 200 is used in the following illustrations. The chip 200 includes, for example, a plurality of bonding pads 202, a plurality of testing pads 204, a plurality of fuses 206 and a passivation layer 208. The passivation layer 208 has a plurality of openings that expos the bonding pads 202 and the testing pads 204.

Figure 6:
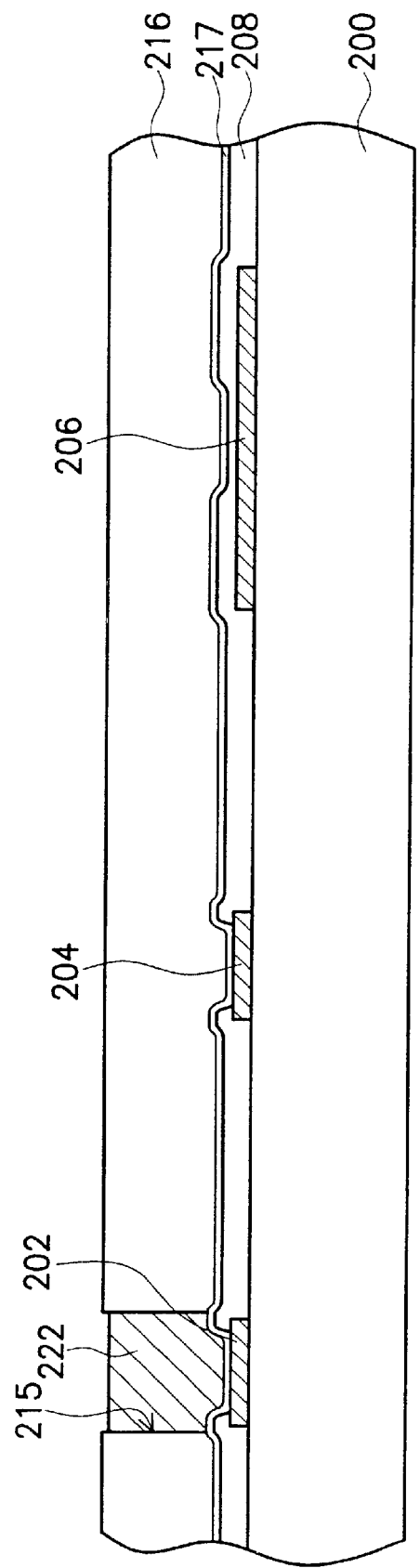

As shown in FIG. 6, a conductive layer 217 is formed over the chip 200. The conductive layer 217, for example, can be a titanium/copper alloy layer or an aluminum/nickel/vanadium/copper composite layer formed by sputtering. A patterned photoresist layer 216 is formed over the chip 200. The patterned photoresist layer 216 has a plurality of openings 215 that expose various bonding pads 202. These openings 215 are subsequently used to pattern the locations for forming bumps. After patterning the photoresist layer 216, an electroplating method may be used to deposit soldering material 222 into the openings 215. The soldering material 222 includes, for example, a lead/tin alloy.

Figure 7:
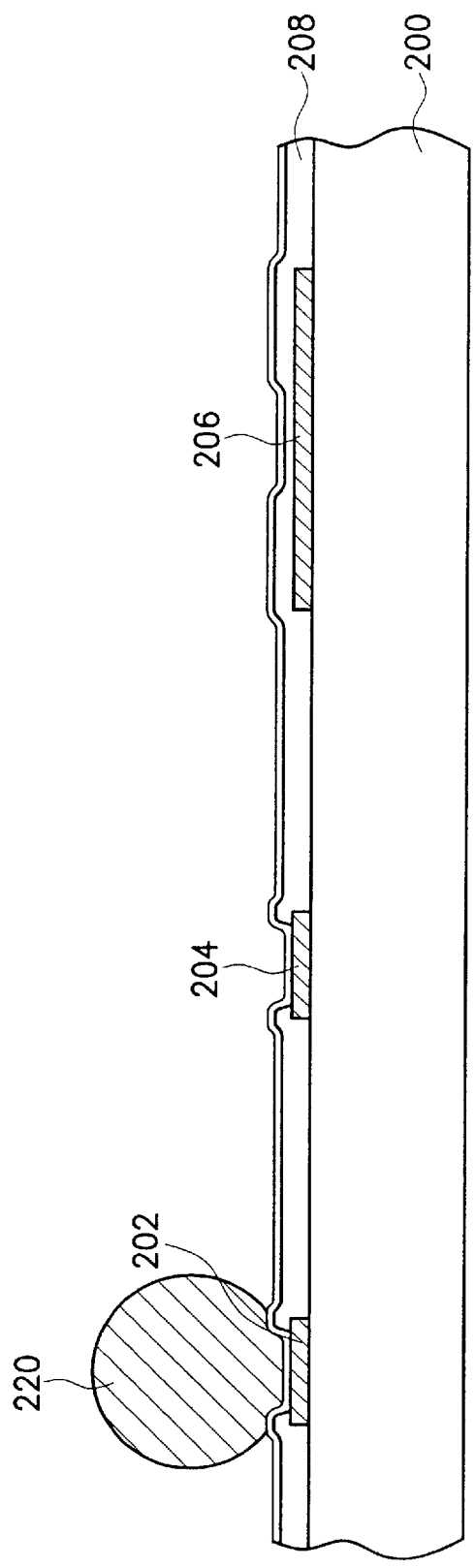

As shown in FIG. 7, the patterned photoresist layer 216 is removed. A reflow operation is conducted so that the soldering material 222 above the bonding pad 202 softens and turns into a bump 220 having a spherical shape due to surface tension.

Figure 8:
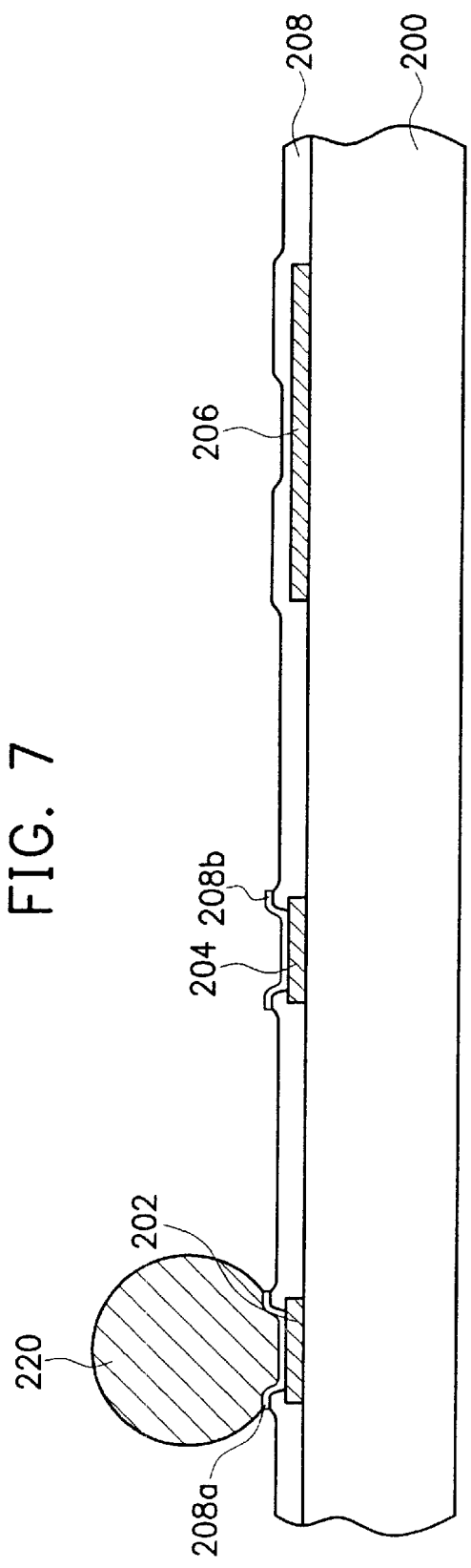

As shown in FIG. 8, a portion of the conductive layer 217 is removed so that only the conductive layer 217 underneath the bump 220 and the conductive layer 217 above the testing pad 204 are retained. Hence, a bottom metallic layer 218a is formed under the bump 220 and a bottom metallic layer 218b is formed over the testing pad 204. Since the bottom metallic layer 218b covers the testing pad 204, a subsequent test is conducted by probing the upper surface of the bottom metallic layer 218b. The results of the testing are identical to probing the test pad 204 directly. In other words, the presence of the bottom metallic layer 218b has no observable effect on the testing operation.

Figure 9:
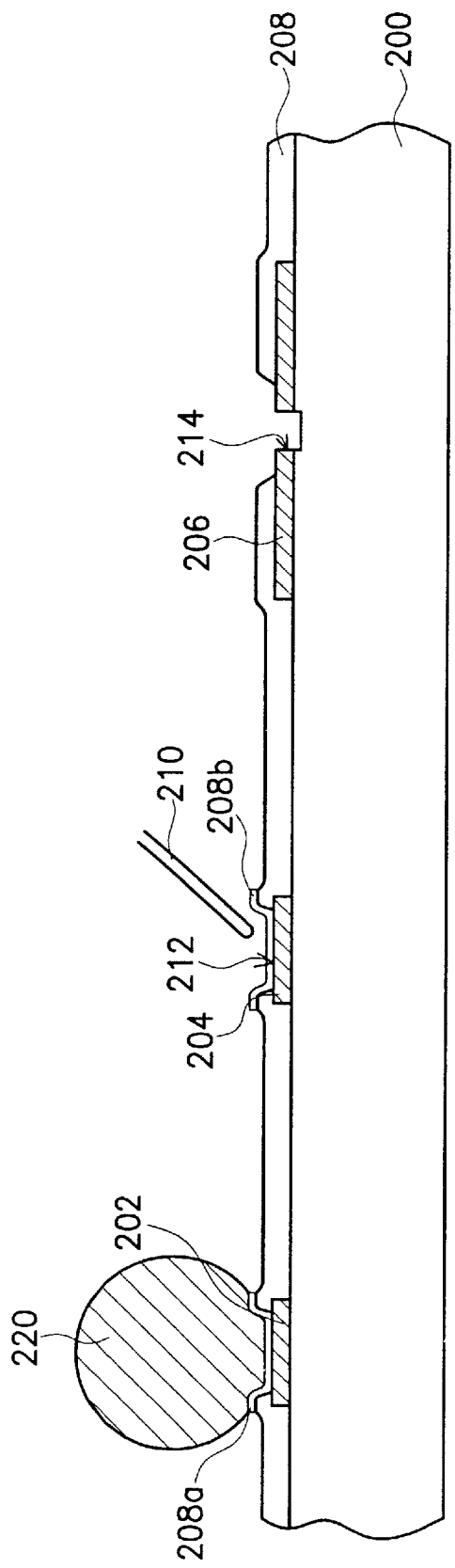

As shown in FIG. 9, a testing tool such a probing pin 210 contacts the bottom metallic layer 218b above the testing pad 204 and forms a test mark 212 on the bottom metallic layer 218b. When defects are found in the circuit, a laser repair is conducted by vaporizing the passivation layer 208 above the fuse 206 and melting the fuse 206 to form a broken section 214. Hence, a redundant bit line now replaces the original bit line. After the laser repair, overall yield of the chips 200 in the silicon wafer is increased.

In the first embodiment, a second passivation layer with openings therein for protecting the chip is not required. Hence, the laser repair operation requires fewer steps and cost less.

Figure 10:
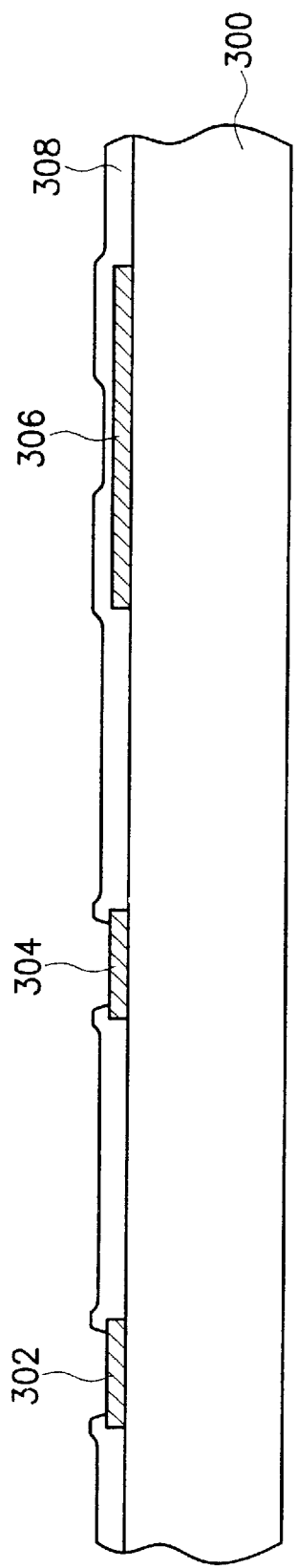

FIGS. 10 through 14 are schematic cross-sectional views showing the progression of steps in a laser repair operation according to a second preferred embodiment of this invention. As shown in FIG. 10, a silicon wafer having a plurality of chips 300 thereon is provided. Only a single chip 300 is used in the following illustration. The chip 300 includes, for examples, a plurality of bonding pads 302, a plurality of testing pads 304, a plurality of fuses 306 and a passivation layer 308. The passivation layer 308 has a plurality of openings that expose the bonding pads 302 and the testing pads 304.

Figure 11:
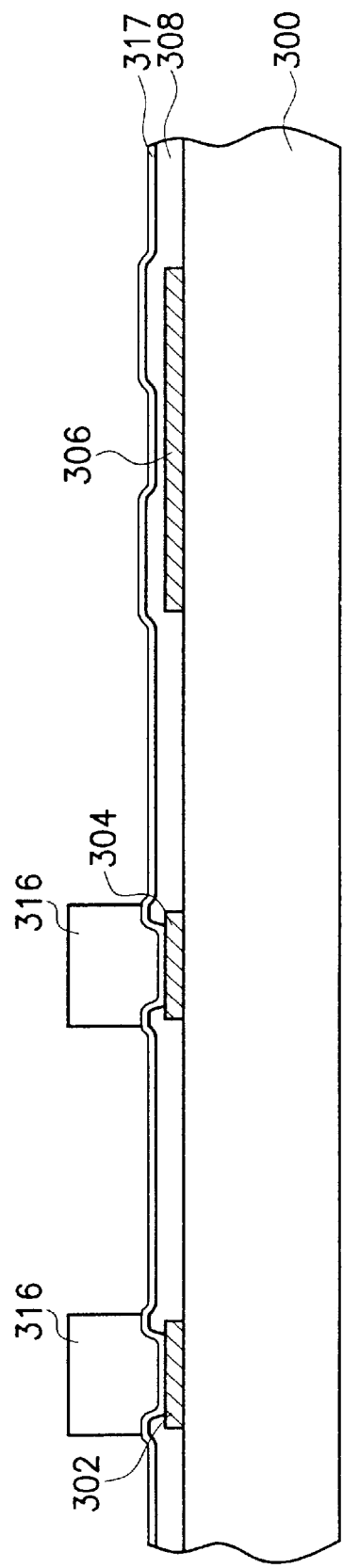

As shown in FIG. 11, a conductive layer 317 is formed over the chip 300. The conductive layer 317, for example, can be a titanium/copper alloy layer or an aluminum/nickel/vanadium/copper composite layer formed by sputtering. A patterned photoresist layer 316 is formed over the chip 300. The patterned photoresist layer 316 covers various bonding pads 302 and various testing pads 304 marking out the locations for forming bottom metallic layers.

Figure 12:
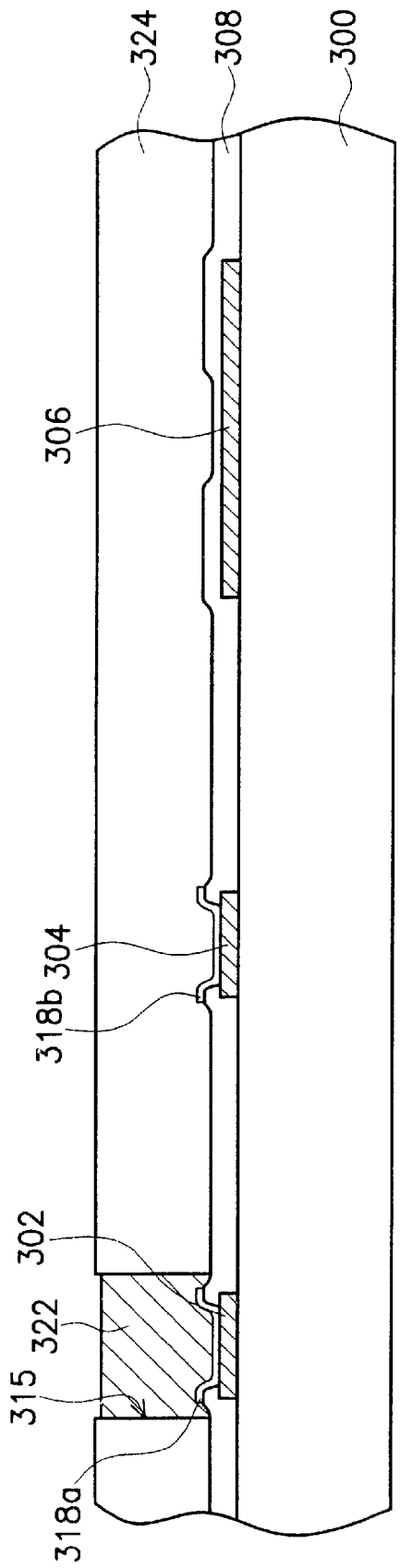

As shown in FIG. 12, using the patterned photoresist layer 316 as a mask, etching is conducted to remove a portion of the conductive layer 317. Ultimately, a bottom metallic layer 318a is formed over the bonding pads 302 and a bottom metallic layer 318b is formed over the testing pads 304. Thereafter, a solder printing step is conducted. In solder printing, a stencil is provided or a patterned photoresist layer 324 is formed over the chip 300. The stencil or the photoresist layer 324 has a plurality of openings 315 that corresponds to the bonding pads 302. After patterning out the bump locations, solder material 322 is applied via a blade or other tools to fill the openings 315 of the stencil or the patterned photoresist layer 324.

As shown in FIG. 13, the stencil or the patterned photoresist layer 324 is removed. A reflow operation is conducted to melt the solder material 322 above the bonding pad 302 and form a bump 320 having a spherical profile due to surface tension. Since the bottom metallic layer 318b covers the testing pad 304, a subsequent test is conducted by probing the upper surface of the bottom metallic layer 318b. The results of the testing are identical to probing the test pad 304 directly. In other words, the presence of the bottom metallic layer 318b has no observable effect on the testing operation.

As shown in FIG. 14, a testing tool such a probing pin 310 contacts the bottom metallic layer 318b above the testing pad 304 and forms a test mark 312 on the bottom metallic layer 318b. When defects are found in the circuit, a laser repair is conducted by vaporizing the passivation layer 308 above the fuse 306 and melting the fuse 306 to form a broken section 314. Hence, a redundant bit line now replaces the original bit line. After the laser repair, overall yield of the chips 300 in the silicon wafer is increased.

In the second embodiment, a second passivation layer with openings therein for protecting the chip is not required. Hence, the laser repair operation requires fewer steps and cost less than a conventional laser repair operation.

In conclusion, major advantages of the laser repair operation in this invention include:

1. Production of the bottom metallic layer is carried out before laser repair. Hence, broken fuses are not exposed to any etchant. Since there is no exposure to damaging etchant, forming a benzene/cyclobutene layer or polyimide layer (a second passivation layer) is unnecessary.
2. Fewer production steps are required because a second passivation layer need not be formed over the chips. Furthermore, without the second passivation layer, steps for forming openings in the second passivation layer are unnecessary.
3. The application of a probe to the bottom metallic layer above the testing pad produces results that are identical to the application of a probe to the testing pad directly. Moreover, the laser repair operation can be carried out together with any bump-forming process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A laser repair operation, comprising:

providing a silicon wafer having a plurality of chips therein, wherein each chip has a plurality of bonding pads, a plurality of testing pads, a plurality of fuses an a passivation layer over the chip with the passivation layer having a plurality of openings exposing the bonding pads and the testing pads;

forming a metallic layer over the wafer;

removing a portion of the metallic layer so that a first bottom metallic layer is formed over each bonding pad and a second bottom metallic layer is formed over each testing pad;

coating a plurality of solder materials over the boding pads by printing;

conducting a reflow operation t transform the plurality of solder materials into a plurality of bumps;

performing a testing operation by probing a surface of the second bottom metallic layer; and conducting a laser repair.

2. The laser repair operation of claim 1, wherein in the metallic layer includes a titanium/copper alloyed composite layer.

3. The laser repair operation of claim 1, wherein in the metallic layer includes an aluminum/nickel/vanadium/copper alloyed composite layer.

4. The laser repair operation of claim 1, wherein performing the laser repair includes breaking a fuse by aiming a laser beam a the fuse.

* * * * *